(12) United States Patent
Kageyama et al.

(10) Patent No.: US 10,712,384 B2
(45) Date of Patent: Jul. 14, 2020

(54) CIRCUIT INSPECTION METHOD AND SAMPLE INSPECTION APPARATUS

(71) Applicant: HITACHI HIGH-TECH CORPORATION, Minato-ku, Tokyo (JP)

(72) Inventors: Akira Kageyama, Tokyo (JP); Yasuhiko Nara, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 140 days.

(21) Appl. No.: 15/756,931

(22) PCT Filed: Jul. 22, 2016

(86) PCT No.: PCT/JP2016/071477
§ 371 (c)(1),
(2) Date: Mar. 1, 2018

(87) PCT Pub. No.: WO2017/038293
PCT Pub. Date: Mar. 9, 2017

(65) Prior Publication Data
US 2018/0246166 A1 Aug. 30, 2018

(30) Foreign Application Priority Data
Sep. 2, 2015 (JP) ................................ 2015-172460

(51) Int. Cl.
*G01R 31/305* (2006.01)
*H01J 37/26* (2006.01)
(Continued)

(52) U.S. Cl.
CPC ....... *G01R 31/305* (2013.01); *G01R 31/2836* (2013.01); *H01J 37/268* (2013.01); *H01J 37/28* (2013.01); *G01R 27/02* (2013.01)

(58) Field of Classification Search
CPC .. G01R 31/305; G01R 31/2836; G01R 27/02; G01R 31/307; G01R 31/2898;
(Continued)

(56) References Cited

U.S. PATENT DOCUMENTS 4,980,639 A 12/1990 Yoshizawa et al.
5,430,292 A * 7/1995 Honjo ..................... G03F 1/86
250/310

(Continued)

FOREIGN PATENT DOCUMENTS

JP 61-207028 A 9/1986
JP 2002-055146 A 2/2002
(Continued)

OTHER PUBLICATIONS

Office Action dated May 20, 2019 for Korean Application No. 10-2018-7005599.
(Continued)

*Primary Examiner* — Giovanni Astacio-Oquendo
(74) *Attorney, Agent, or Firm* — Miles & Stockbridge, P.C.

(57) ABSTRACT

An object of the present invention relates to detecting a signal caused by a faulty point part of which the identification has been difficult with conventional EBAC. In an embodiment of the present invention, at least one probe is brought into contact with a sample on which a circuit is formed, the sample is scanned with a charged particle beam while power is supplied via the probe to the circuit identified by a contact of the probe, and a change in resistance value of a faulty point heated locally is measured via the probe. According to the present invention, even a signal caused by a high-resistance faulty point or a faulty point embedded in the sample can be easily detected.

15 Claims, 6 Drawing Sheets

(51) Int. Cl.
*H01J 37/28* (2006.01)
*G01R 31/28* (2006.01)
*G01R 27/02* (2006.01)

(58) Field of Classification Search
CPC .......................... G01R 31/2879; G01R 27/08;
G01R 19/0061; H01J 37/268; H01J 37/28
USPC ......................................... 324/525, 512, 500
See application file for complete search history.

(56) References Cited

U.S. PATENT DOCUMENTS

| | | | |
|---|---|---|---|
| 7,079,433 B1 * | 7/2006 | Chen | G11C 29/006 |
| | | | 365/190 |
| 9,910,053 B2 * | 3/2018 | Bakhru | G01N 33/86 |
| 2006/0076503 A1 * | 4/2006 | Tsao | H01J 37/228 |
| | | | 250/396 R |
| 2006/0273263 A1 * | 12/2006 | Raymond | G01B 11/0616 |
| | | | 250/492.2 |
| 2009/0250610 A1 | 10/2009 | Nara et al. | |
| 2013/0119999 A1 | 5/2013 | Obuki et al. | |
| 2014/0320144 A1 * | 10/2014 | Nakaya | G01R 31/367 |
| | | | 324/434 |
| 2017/0264110 A1 * | 9/2017 | Toya | H02J 7/0021 |

FOREIGN PATENT DOCUMENTS

| | | |
|---|---|---|
| JP | 2008-203075 A | 9/2008 |
| JP | 2009-252854 A | 10/2009 |
| JP | 2010-135684 A | 6/2010 |
| JP | 2012-033604 A | 2/2012 |
| WO | WO 2013/073387 A1 | 5/2013 |

OTHER PUBLICATIONS

Office Action dated Dec. 7, 2018 for Korean Application No. 10-2018-7005599.
Japanese Office Action dated Feb. 26, 2019 for JP Application No. 2017-537646.

* cited by examiner

[Fig. 1]
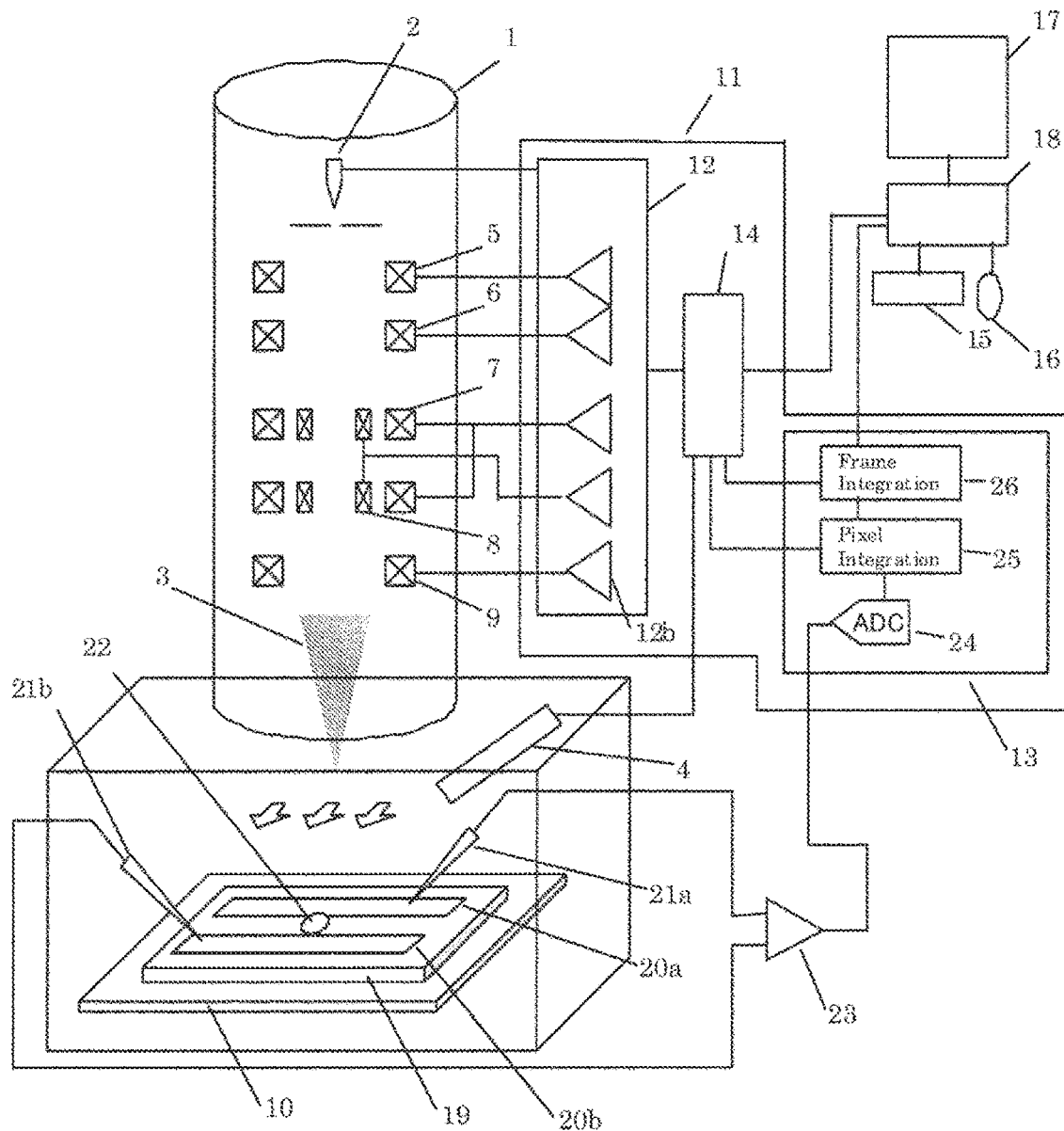

[Fig. 2]
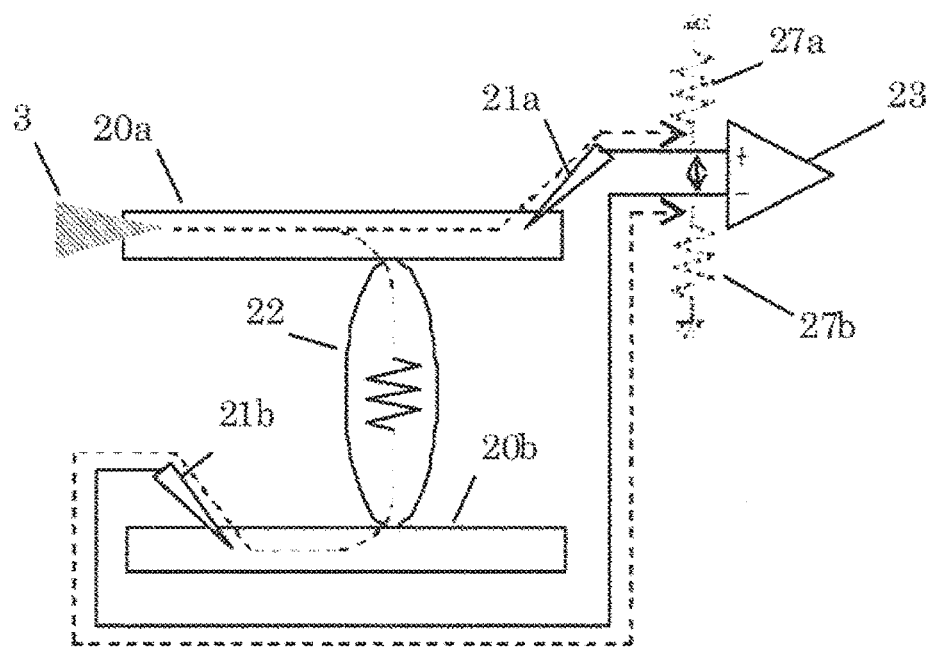

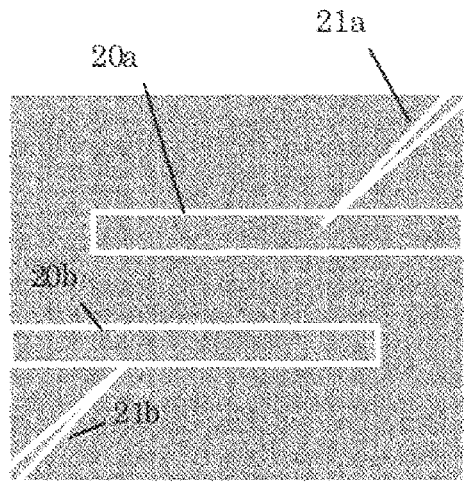
[FIG. 3] (a)
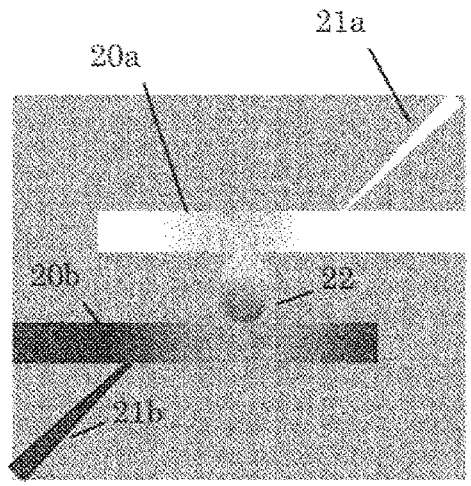
[FIG. 3] (b)
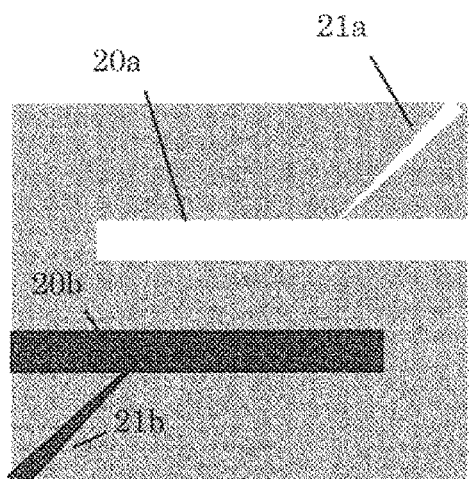
[FIG. 3] (c)
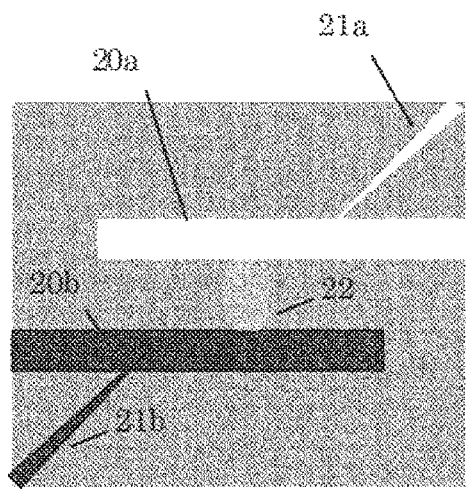
[FIG. 3] (d)

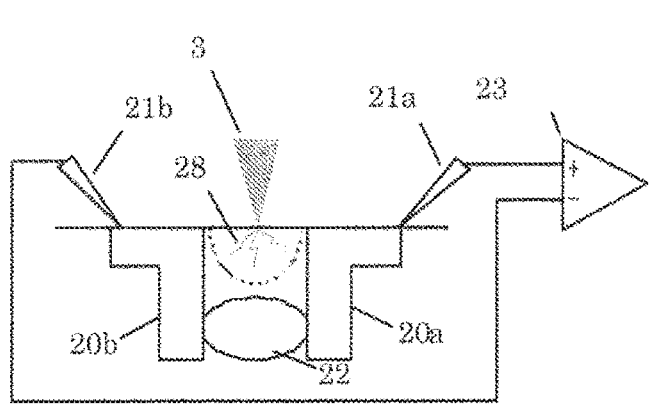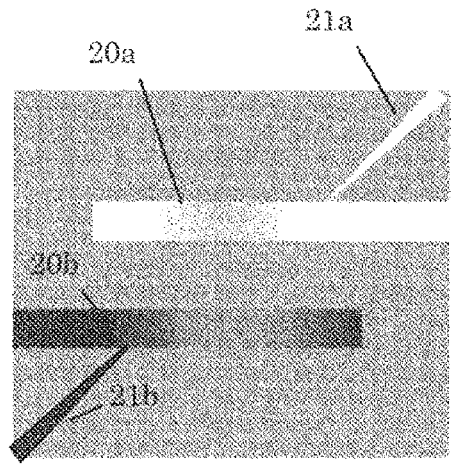
[FIG. 4] (a)   [FIG. 4] (b)
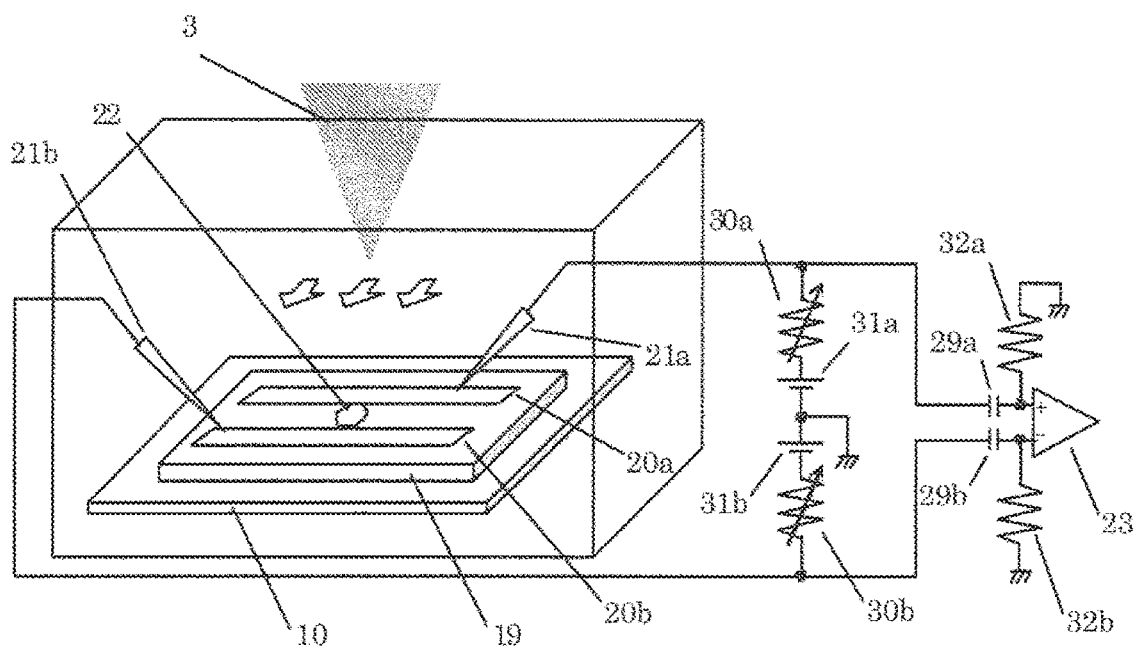
[Fig. 5]

[Fig. 6]
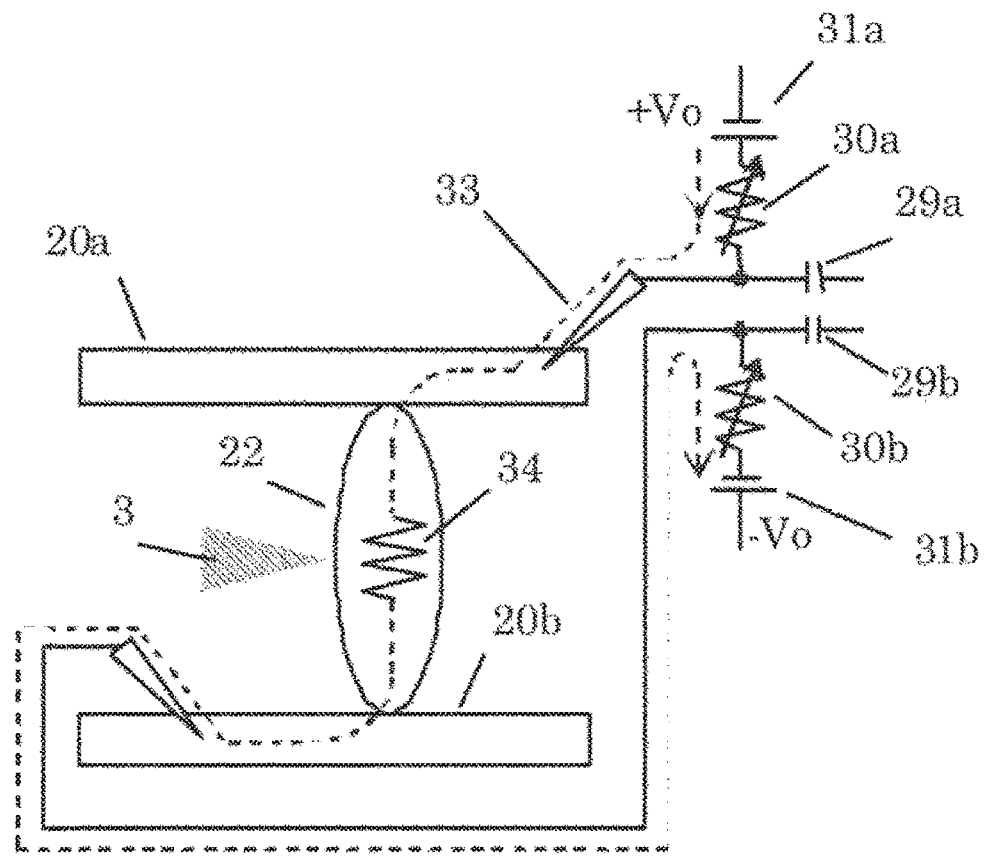
[Fig. 7]
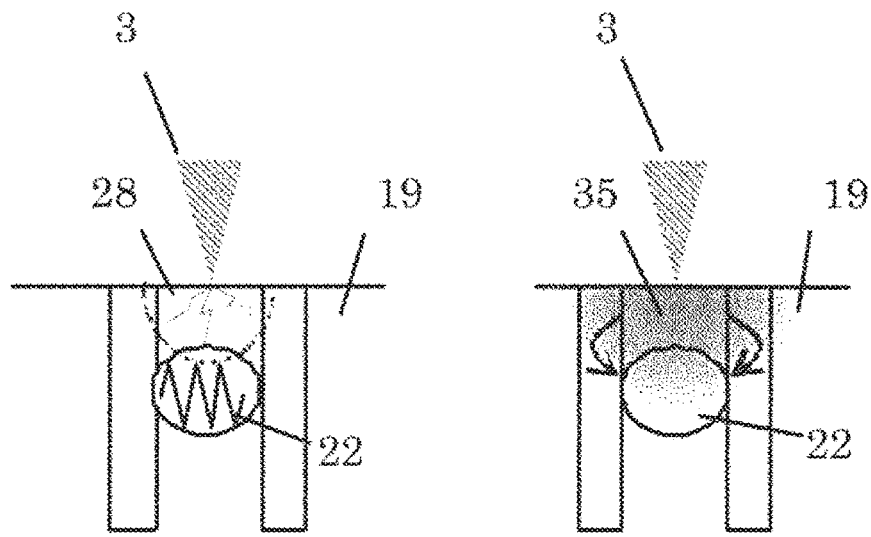

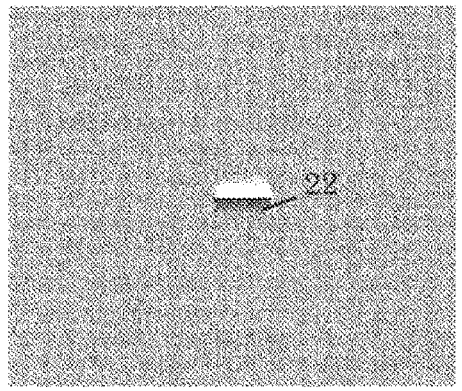
[FIG. 8] (a)
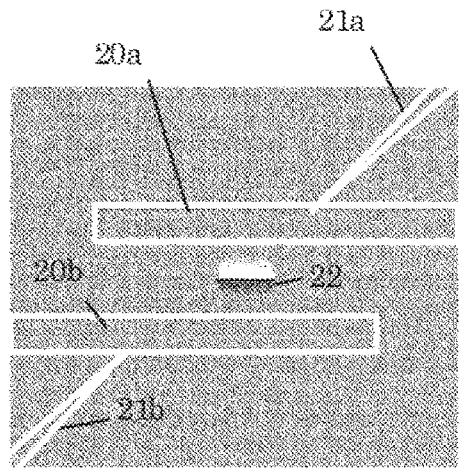
[FIG. 8] (b)
[Fig. 9]
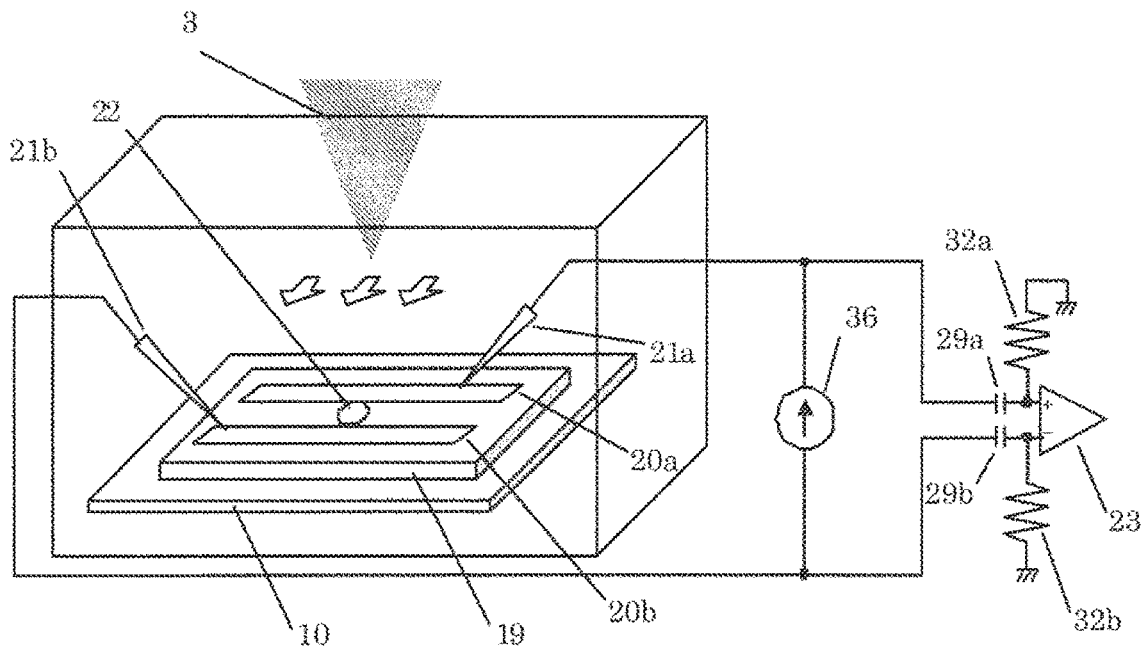

CIRCUIT INSPECTION METHOD AND SAMPLE INSPECTION APPARATUS

TECHNICAL FIELD

The present invention relates to a circuit inspection method and a sample inspection apparatus for analyzing faulty points in a circuit identified by a contact of a probe while bringing at least one probe into contact with semiconductor and other samples on which a circuit is formed, and irradiating samples with a charged particle beam.

BACKGROUND ART

In the faulty point analysis of a semiconductor sample having a circuit formed on a semiconductor surface, it is important to identify a faulty point part. On the other hand, it is difficult to identify a faulty point part due to microfabrication of a device in recent years. As a result, it takes an enormous amount of time in the faulty point analysis. Therefore, at present, an optical beam induced resistance change (OBIRCH), an electron beam (EB) tester and other analyzers have been used for this type of faulty point analysis.

Among others, in the field of the faulty point analysis of a wire, a technology that irradiates the semiconductor samples with the charged particle beam typified by an electron beam, brings a probe into contact with samples, analyzes a current absorbed by the wire or secondary signals (for example, secondary electrons or reflection electrons) emitted from the semiconductor samples and images them has attracted attention. A distribution image of a signal (absorption current signal) obtained on the basis of a current (absorption current) absorbed by the wire is referred to as an electron beam absorbed current image (EBAC).

JP-A-2008-203075 (Patent Literature 1) discloses an absorption current detection apparatus that irradiates a wire pattern on a sample surface with a charged particle beam, brings two probes a and b into contact with the wire pattern, and measures an absorption current flowing into the probe a and b. In Patent Literature 1, it is characterized that the apparatus is configured to apply an absorption current flowing into the probe a and b to a current/voltage converter through an input resistor having a predetermined resistance value for adjusting an output voltage.

On the other hand, JP-A-2009-252854 (Patent Literature 2) discloses a technology that easily identifies a faulty point part, by varying a temperature of a sample when absorption current images are generated and acquiring a difference image between the absorption current images generated at each temperature, even if a signal displacement between a faulty portion and a normal portion is small.

CITATION LIST

Patent Literature

PTL 1: JP-A-2008-203075
PTL 2: JP-A-2009-252854

SUMMARY OF INVENTION

Technical Problem

The inventors finally have reached the following knowledge of identifying a faulty point part having a high-resistance value.

As in Patent Literature 1, in a case where a resistance value of a faulty point part is high (hereinafter, such a faulty point is referred to as a high-resistance faulty point) in the conventional EBAC apparatus utilizing an irradiated electron beam as a signal source, an absorption current is reduced, and a signal displacement is reduced. Therefore, it is difficult to distinguish a normal state maintaining insulation between the wires, from a state having a high-resistance faulty point between the wires.

To increase a signal amount of EBAC, it is conceivable to increase irradiation dose of an electron beam. However, with the increase on irradiation dose of an electron beam, damage, an amount of contamination, and charged quantity due to the electron beam simultaneously increase in a sample. Furthermore, in a case where a faulty point is embedded in a sample, diffusion of electrons occurs inside sample and thus it is difficult to identify the position of a faulty point.

On the other hand, in the apparatus as shown in Patent Literature 2, since a sample is generally heated up or cooled down, it is possible to easily identify a faulty point part. However, in techniques of the apparatus, since it is not intended to locally change the temperature of a sample, it is not possible to extract a signal caused by a local temperature change in a faulty point part (and the vicinity thereof) and thus it is difficult to identify a high-resistance faulty point.

An object of the present invention relates to detecting a signal caused by a faulty point part of which the identification has been difficult with conventional EBAC.

Solution to Problem

To solve the above problems, in one embodiment of the present invention, at least one probe is brought into contact with a sample on which a circuit is formed, a sample is irradiated with a charged particle beam while power is supplied via the probe to a circuit identified by a contact of the probe, and a change in the resistance value of a faulty point heated locally is measured via the probe.

Advantageous Effects of Invention

According to the present invention, it is possible to easily detect a signal caused by a high-resistance faulty point or a faulty point embedded in a sample.

BRIEF DESCRIPTION OF DRAWINGS

FIG. 1 is a schematic diagram of a basic configuration of sample inspection apparatus according to Example 1.

FIG. 2 is a principle diagram when forming an EBAC image in sample inspection apparatus according to Example 1.

FIGS. 3(a) to 3(d) are schematic views of SEM image and EBAC image obtained by sample inspection apparatus according to Example 1.

FIGS. 4(a) and 4(b) are schematic views of an embedded faulty point and EBAC image thereof.

FIG. 5 is a schematic diagram of an overall structure of sample inspection apparatus according to Example 1.

FIG. 6 is a measuring principle diagram of sample inspection apparatus according to Example 1.

FIG. 7 is a schematic view showing the movements of electrons and heat in an embedded faulty point.

FIGS. 8(a) and 8(b) are schematic views of a DI-EBAC image obtained by sample inspection apparatus according to Example 1, and an image obtained by superimposing a SEM image with DI-EBAC image.

FIG. 9 is a schematic diagram of an overall structure of sample inspection apparatus according to Example 2.

DESCRIPTION OF EMBODIMENTS

In the Examples, there is disclosed a circuit inspection method for performing a faulty point analysis of a circuit, including: bringing at least one probe into contact with a sample on which a circuit is formed, scanning the sample with a charged particle beam while power is supplied via the probe to a circuit identified by a contact of the probe, and measuring a change in the resistance value of a faulty point heated locally via the probe.

Further, in the Examples, there is disclosed a circuit inspection method including: applying a constant voltage to the circuit identified by a contact of the probe to supply power to the circuit, and measuring a change of end-to-end voltage over a faulty point upon heating to measure a change in the resistance value of the faulty point.

Further, in the Examples, there is disclosed a circuit inspection method, including: supplying a steady current to a circuit identified by a contact of a probe to supply power to the circuit, and measuring a change of end-to-end voltage over the faulty point upon heating to measure a change in the resistance value of the faulty point.

Further, in the Examples, there is disclosed a circuit inspection method, including: time-differentiating a signal measured by the probe to measure a change in the resistance value of a faulty point.

Further, in the Examples, there is disclosed a circuit inspection method, including: imaging a change in the resistance value of a faulty point in synchronization with the scanning of a charged particle beam.

Further, in the Examples, there is disclosed a circuit inspection method, including: detecting secondary particles generated with the irradiation of a charged particle beam to image surface information of a sample, imaging a change in the resistance value of a faulty point in synchronization with the scanning of a charged particle beam, and superimposing an image according to the change in the resistance value of a faulty point on an image of the surface information to identify a position of the faulty point.

Further, in the Examples, there is disclosed a sample inspection apparatus including: a sample stage with a sample mounted thereon, a charged particle beam irradiation system that irradiates the sample with a charged particle beam, at least one probe that is brought into contact with a sample, and a power supply that supplies power via the probe to a circuit identified by a contact of the probe, wherein, while the power supply supplies power to the circuit identified by the contact of the probe, the charged particle optical system scans a sample with a charged particle beam and measures a change in the resistance value of a faulty point heated locally via the probe.

Further, in the Examples, there is disclosed a sample inspection apparatus, wherein the power supply for supplying power to a circuit is a constant voltage source for applying a constant voltage.

Further, in the Examples, there is disclosed a sample inspection apparatus, wherein the power supply for supplying power to a circuit is a constant current source for applying a steady current.

Further, in the Examples, there is disclosed a sample inspection apparatus, further including: a differentiation circuit that is connected with the probe, wherein the differentiation circuit time-differentiates a signal according to a change in the resistance value of a faulty point obtained via the probe.

Further, in the Examples, there is disclosed sample inspection apparatus, further including: an image display unit that displays an image obtained by synchronizing a signal according to a change in the resistance value of a faulty point with the scanning of a charged particle beam.

Further, in the Examples, there is disclosed sample inspection apparatus, further including: a detector that detects secondary particles generated with the irradiation of a charged particle, and an image display unit that displays a superimposed image with a surface image of a sample obtained by the secondary particles and an image obtained by synchronizing a signal according to a change in the resistance value of a faulty point with the scanning of the charged particle beam.

Hereinafter, above and other novel features and effects will be described with reference to drawings.

EXAMPLE 1

FIG. 1 is a schematic diagram of a basic configuration of a sample inspection apparatus according to this embodiment. The sample inspection apparatus includes, for example, an SEM column 1 that irradiates the sample 19 having a faulty point 22, with an electron beam 3 of charged particle beam, a sample stage 10 with the sample 19 mounted thereon, and the probes 21a, 21b that are brought contact into the conductors 20a, 20b made of copper or aluminum, and the like on the sample 19 and measures a potential between the conductors 20a, 20b. Further, a sample inspection apparatus includes a control unit 11 for controlling an element such as the SEM column 1 and the probes 21a, 21b.

The present embodiment is to provide two probes, however, for example, only probe 21a may be provided in a case where a conductor 20b is grounded. Furthermore, there may be a configuration having three or more probes.

Control unit 11 includes, for example, an electron beam control unit 12 for controlling an electronic optical element such as an electron source 2, a first convergence lens 5, an image processing unit 13 that forms a SEM image from information of detector 4, and system control means 14 for controlling each constituent unit. Furthermore, the sample inspection apparatus includes a computer 18 provided with a keyboard 15 for giving instruction to the apparatus as an input device, a mouse 16 as a pointing device, and an image display 17.

The image processing unit 13 includes, for example, an A/D converter 24, a pixel integration unit 25, and a frame integration unit 26. The A/D converter 24 converts a signal input from a differential amplifier 23 into digital data, the pixel integration unit 25 converts a signal input in synchronization with a scanning signal into a gradation value per pixel, and the frame integration unit 26 forms image data and transmits the image data to the computer 18.

The SEM column 1 includes the electron source 2 for emitting the electron beam 3. Electron beam 3 emitted from the electron source 2 is focused onto the sample 19 by passing through, for example, a first convergence lens 5, a second convergence lens 6, deflection coils 7, electrical field movement coils 8, and an objective lens 9, and an arbitrary position of sample 19 is scanned with the electron beam 3. A focal position of the electron beam 3 that irradiated onto the sample 19 is adjusted by varying a current flowing through objective lens 9 by means of an objective lens driving unit 12b in electron beam control unit 12.

The sample inspection apparatus forms a SEM image by irradiating the sample 19 or the probes 21a, 21b and the like with the electron beam 3 and by detecting secondary particles generated on outermost surface of the sample 19 or the probes 21a, 21b and the like using a detector 4.

In a case where conductors 20a or 20b on the sample 19 is irradiated with the electron beam 3 irradiated on the sample, electric charges are accumulated in conductors 20a or 20b to cause a potential to be generated. The potential is extracted by the probes 21a, 21b and is input to the differential amplifier 23. In a case where there is no conduction between conductors 20a and 20b, a potential difference is generated between conductors 20a and 20b. On the other hand, in a case where there is conduction between the conductors, there is no potential difference between the conductors.

The presence or absence of a potential difference between conductors 20a and 20b is amplified by the differential amplifier 23, and the amplified potential difference is input to the image processing unit 13 and then is converted into an image. Therefore, an EBAC image is obtained. The computer 18 that has received information transmitted from the image processing unit 13 displays the received image data on an image display 17 as an EBAC image. Through the observation of EBAC image, it is possible to check whether there is presence or absence of conduction between the conductors, and thus identify a short-circuited faulty point (that is, a faulty point in a case where there is conduction at a place where there originally is not conduction between the conductors) part or an open faulty point (that is, a faulty point in a case where there is no conduction at a place where there originally is conduction between the conductors) part.

FIG. 2 is a principle diagram when forming an EBAC image in the sample inspection apparatus. In a case where a conductor 20a is irradiated with the electron beam 3 during scanning the surface of the sample 19, charges are input to a positive side of the differential amplifier 23 through the probe 21a.

At this time, in a case where the faulty point 22 having a certain resistance value is in contact with conductors 20a and 20b, charges flow into the conductor 20b through the faulty point 22, the charges input to a negative side of the differential amplifier 23 through the probe 21b. The potential of the conductor 20b is lower than the potential of the conductor 20b as much as a voltage drop over the faulty point 22.

In a case where the resistance value of the faulty point 22 is low, since an amount of a voltage drop is less and thus a potential difference between conductors 20a and 20b is small, it is possible to recognize the faulty point 22 as a short-circuited faulty point. However, in a case where the resistance value of the faulty point 22 is high, for example, it is greater than input impedances 27a or 27b of the differential amplifier 23, a current hardly flows over the faulty point 22. Therefore, a potential difference between conductors 20a and 20b is generated, it is difficult to distinguish from a state where there is no faulty point 22.

FIG. 3(a) is a schematic view of a SEM image obtained in a case where the sample 19 and the probes 21a, 21b are irradiated with the electron beam 3. Since secondary particles are generated at the ends of a sample and the like, there is obtained an image with the outlines of the sample 19 and the probes 21a, 21b being emphasized. On the other hand, in a case where the faulty point 22 is embedded in a sample, a faulty point is neither higher nor lower than surroundings even if the faulty point is not embedded in a sample, or a faulty point is unusually small, and the like, the faulty point 22 hardly appears in a SEM image.

FIG. 3(b) is a schematic view of an EBAC image in a case where the faulty point 22 is a short-circuited faulty point. Even if the faulty point 22 does not appear in the SEM image, the electron beam 3 reaches to the faulty point 22. Therefore, in the EBAC image, a contrast having gradation between probes 21a and 21b is generated. The degrees of the gradation differ depending on lengths or resistance values of the conductors 20a, 20b or the faulty point 22, and the like. As a result, it is possible to identify a part of a faulty point 22 that cannot be identified in the SEM image.

FIG. 3(c) is a schematic view of an EBAC image in a normal case where the faulty point 22 is not present. In this example, since the faulty point 22 is not present, there is no conduction between conductors 20a and 20b. Therefore, with the irradiation of the electron beam 3, a potential difference is generated between conductors 20a and 20b. As a result, a clear contrast is generated in the EBAC image.

On the other hand, in a case where the faulty point 22 is a high-resistance faulty point, it is difficult to distinguish from a state where there is no faulty point. FIG. 3(d) shows EBAC image in a case where the faulty point 22 is a high-resistance faulty point. In a case where the resistor of the faulty point 22 is high, there is almost no conduction between conductors 20a and 20b (a current hardly flows into the faulty point 22). As a result, regardless of the presence of the faulty point 22, a potential difference is generated between conductors 20a and 20b, and thus almost the same contrast as shown in FIG. 3(c) is generated in the EBAC image. Furthermore, depending on the resistance value of the faulty point 22, the luminance at the part of the faulty point 22 becomes almost the same degree as the luminance of its surroundings. Therefore, it is difficult to identify the position of the faulty point 22.

Further, FIG. 4(a) shows a schematic diagram in a case where the faulty point 22 is deeply embedded in the sample 19. FIG. 4(a) is a side view of the sample 19 (in the vertical direction of a direction in which the electron beam is radiated). Faulty point 22 is present between conductors 20a and 20b, and the faulty point is deeply positioned and embedded in the sample 19.

The range radius 28 in a sample of the electron beam 3 generally ranges from several nanometers to several micrometers depending on an accelerated voltage of the electron beam 3 or a material of a sample. Accordingly, in a case where the range radius 28 in a sample of the electron beam 3 is too small to reach to the faulty point 22, no electron is supplied to probes 21a or 21b. As a result, in a case where the faulty point 22 is deeply positioned and embedded in the sample 19, the differential amplifier 23 cannot detect a signal caused by the faulty point 22.

Even if the faulty point 22 is present within range radius 28 in a sample of the electron beam 3, since there may be detected a signal caused by the faulty point 22, the electron beam 3 is scattered when passing through a sample. Therefore, it is difficult to identify an accurate position of the faulty point 22.

FIG. 4(b) shows a schematic diagram of an EBAC image in a case where the faulty point 22 is embedded in the sample 19. Since conductors 20a and 20b have conduction on the faulty point 22, almost the same contrast as shown in FIG. 3(b) is generated in the EBAC image. However, even if the faulty point 22 is scanned with the electron beam 3, since the electron beam 3 does not reach the faulty point 22, the faulty point 22 is not observed in the EBAC image.

FIG. 5 shows a schematic diagram of sample inspection apparatus according to an embodiment of the present invention. It is noted that constituent units such as the SEM column 1 have the same configuration as in FIG. 1, and are not repeatedly illustrated.

According to sample inspection apparatus in this embodiment, even if the faulty point 22 is a high-resistance faulty point, or the faulty point is embedded in the sample 19, it is possible to detect a signal caused by the faulty point 22. In sample inspection apparatus according to this embodiment, variable resistors 30a, 30b and constant voltage power supplies 31a, 31b are respectively connected between the probes 21a, 21b and the differential amplifier 23 as in FIG. 1. Further, it is desirable that capacitors 29a, 29b are provided between the variable resistors 30a, 30b and the differential amplifier 23 for configuring a differentiation circuit. Furthermore, for this case, it is desirable that resistors 32a, 32b for causing an input bias current of the differential amplifier 23 to be grounded and protecting the differential amplifier 23 are respectively connected between the capacitors 29a, 29b and the differential amplifier 23.

FIG. 6 shows a principle view for measuring a signal caused by the faulty point 22 in sample inspection apparatus according to this embodiment. A steady current 33 from the constant voltage power supplies 31a, 31b flows into the faulty point 22 having a resistor 34. At this time, the following voltage $V_{22}$ is applied to both ends of the faulty point 22.

$$V_{22} = R_{34}/(R_{30a} + R_{34} + R_{30b}) \times 2V_o$$

$R_{34}$ is a resistance value of a resistor 34 in the faulty point 22, $R_{30a}$ is a resistance value of variable resistor 30a, $R_{30b}$ is a resistance value of variable resistor 30b, $V_o$ is an output voltage of the constant voltage power supplies 31a, 31b.

Here, in a case where the sample 19 is scanned with the electron beam 3 and the faulty point 22 is irradiated with the electron beam, the faulty point 22 is heated due to kinetic energy that is proportional to an acceleration voltage of the electron beam. Generally, since aresistance also increases as temperature increases, a resistance value $R_{34}$ of the resistor 34 also increases due to the heating of the faulty point 22. In a case where $R_{34}$ increases, end-to-end voltage $V_{34}$ also increases according to the above equation.

In a case where the irradiation of the electron beam 3 on the faulty point 22 is completed, the heat of the faulty point 22 is released to its surroundings. As a result, the temperature of the faulty point 22 returns to the temperature before the irradiation of the electron beam 3, and also the resistance value $R_{34}$ of resistor 34 returns to the original resistance value. That is, end-to-end voltage $V_{34}$ is changed only upon irradiation of the electron beam 3.

Generally, in conductors 20a and 20b and other portions of the sample 19 and the faulty point 22, a change in a resistance value with the irradiation of the electron beam 3 differs according to a difference between thermal conductivity and a temperature characteristic of the resistance value. Therefore, even if the faulty point 22 is a high-resistance faulty point, it is possible to detect a signal caused by the faulty point 22 by detecting a change of an end-to-end voltage (that is, a change in the resistance value $R_{34}$).

This signal may be detected by the differential amplifier 23, but the signal tends to be very small compared to a conventional EBAC signal. To increase an amount of the signal caused by the faulty point 22, it is conceivable to increase irradiation dose of the electron beam 3, or to decrease a scanning speed of the electron beam 3 (that is, to increase an amount of time irradiated on one point). However, in a case where these techniques are adopted, it is likely to increase a damage, an amount of contamination or charged quantity of the sample 19 by the irradiation of the electron beam 3. Furthermore, in a case where a scanning speed decreases, a time required for measuring the sample 19 becomes longer.

Therefore, sample inspection apparatus according to this embodiment detects a very small signal with high accuracy by differentiating a voltage change of the end-to-end voltage $V_{34}$ by means of the capacitors 29a, 29b to output the differentiated result to the differential amplifier 23. Since the inputting is performed through the capacitor, it may handle the faulty point 22 having an arbitrary resistance value by adjusting resistance values of variable resistors 30a, 30b without the influence of the input impedance of the differential amplifier 23.

Further, sample inspection apparatus according to this embodiment may detect a signal caused by the faulty point 22 even if the faulty point 22 is embedded in the sample 19. FIG. 7 is a schematic view for representing orbit of electrons and movement of heat inside sample in a case where the faulty point 22 is inside the sample 19.

In a case where the electron beam 3 is irradiated on the sample 19, electrons are diffused into the internal of the sample 19 within a range radius 28 depending on an acceleration voltage. On the other hand, the kinetic energy of electrons is transmitted as an amount of heat 35. Even if an acceleration voltage of the electron beam 3 is too low for electrons to reach, heat is propagated to the internal of the sample 19 and reaches the faulty point 22.

Further, even if electrons are split out and flow into conductors 20a or 20b, amounts of heat 35 are also transmitted to conductors 20a or 20b at the same time to reach to the faulty point 22. Particularly, in a case where the faulty point 22 is a high-resistance faulty point, a difference in an amount of heat to be transmitted through conductors 20a or 20b having high-thermal conductivity with respect to electrons escaping to conductors 20a or 20b becomes remarkable. In the method using a constant voltage power supply, instead of the electron beam 3, for supplying the end-to-end voltage of the faulty point 22, even if the faulty point 22 is embedded in the sample 19, it is possible to detect the faulty point 22.

FIG. 8(a) shows a schematic view of an image (that is, Dynamic Induced Electron Beam Absorbed Current image (DI-EBAC image)) obtained by synchronizing a differential value of a voltage change of end-to-end voltage $V_{34}$ with the scanning of the electron beam 3. Since the electron beam 3 is irradiated on the faulty point 22 and the temperature of the faulty point 22 increases, only changes in a resistance value of the faulty point 22 are displayed as light and dark.

Even if the faulty point 22 is a high-resistance faulty point, it is possible to identify the position of the faulty point 22 by superimposing an SEM image on the DI-EBAC image. FIG. 8(b) is a schematic view of an image obtained by superimposing an SEM image on DI-EBAC image. By means of only the DI-EBAC image, a position relationship between the faulty point 22 and the conductors 20a, 20b is unclear, but it is found that the position of the faulty point 22 may be identified by superimposing the SEM image thereon.

The sample inspection apparatus according to this embodiment may heat only the faulty point 22 and the vicinity of faulty point by using an electron beam 3 for convergence to the faulty point 22 upon heating (typically, beam diameter ranges from several nanometers to several tens nanometers). Accordingly, the sample inspection apparatus may identify a part of the faulty point 22 with a resolution comparable to the SEM.

It is noted that, instead of the SEM image, by superimposing an EBAC image on a DI-EBAC image, a position of the faulty point 22 may be identified. Further, the sample inspection apparatus may easily control irradiation dose or an accelerated voltage of the electron beam 3, a scanning speed and the like, similar to a general SEM and may inspect a sample under various conditions.

Further, since the electron beam 3 is not only an electron beam for obtaining a SEM image, but also is a heating source for obtaining a DI-EBAC image, the SEM image and the DI-EBAC image may be simultaneously acquired.

As described above, according to this embodiment, it is possible to easily detect a signal caused by a high-resistance faulty point or a faulty point embedded in a sample.

EXAMPLE 2

The sample inspection apparatus according to this embodiment has almost the same configuration as Example 1, but its circuit configuration is different from Example 1. Hereinafter, there will be described points different from Example 1.

FIG. 9 is a schematic diagram of sample inspection apparatus according to this embodiment. Unlike the apparatus of Example 1, the variable resistors 30*a*, 30*b* and constant voltage power supply 31*a*, 31*b* to be grounded are replaced with a constant current source 36.

In the method provided with the variable resistors 30*a*, 30*b* and the constant voltage power supplies 31*a*, 31*b*, it is necessary to match the resistance value $R_{34}$ with variable resistors 30*a*, 30*b* in a case where the faulty point 22 having a resistor 34 of the resistance value $R_{34}$ is measured. Therefore, in a case where the resistance value $R_{34}$ is an unknown value, or the resistance value $R_{34}$ changes with the lapse of time, the resistance values of variable resistors 30*a*, 30*b* needs to be adjusted every time, and thus procedure for measurement become complicated. Therefore, the sample inspection apparatus according to this embodiment may perform a measurement simply by using the constant current source 36.

In a case where a current value generated by the constant current source 36 is $I_0$, the voltage of $V_{22}=R_{34} \times I_0$ is applied to the faulty point 22 having resistor 34 of the resistance value $R_{34}$. Here, in a case where a change in the resistance value $R_{34}$ of resistor 34 varies with the irradiation of the electron beam 3, $V_{22}$ varies depending on the change. It is possible to measure a signal caused by the faulty point 22 by directly measuring the change of $V_{22}$, or by measuring the change through the capacitors 29*a*, 29*b*, and the differential amplifier 23, thereby configuring a differential circuit.

As described above, according to this embodiment, by using the constant current source 36, it is possible to detect a signal caused by the faulty point 22 without adjusting the values of variable resistors.

In the Examples 1 and 2, there has been described an apparatus using the electron beam 3 as a charged particle beam, but ion beam also may be used. Furthermore, in the Examples, differential amplifier 23 is used for amplifying a signal of the faulty point 22, but a simple current amplification or voltage amplification, without being limited to the differential amplification. Further, the SEM column 1 and the probes 21*a*, 21*b* are controlled by one control unit 11, but the SEM and the probes may be separate devices and may be controlled independently with one another.

In addition, it is possible to replace, add, or remove constituent units in a range without changing the subject matter of the invention.

REFERENCE SIGNS LIST

1: SEM column, 2: electron source, 3: electron beam, 4: detector, 5, 6: convergence lens, 7: deflection coils, 8: electrical field movement coils, 9: objective lens, 11: control unit, 12: electron beam control unit, 12*b*: objective lens driving unit, 13: image processing unit, 14: system control means, 15: keyboard, 16: mouse, 17: image display, 18: computer, 19: sample, 20*a*, 20*b*: conductor, 21*a*, 21*b*: probe, 22: faulty point, 23: differential amplifier, 24: A/D converter, 25: pixel integration unit, 26: frame integration unit, 28: range radius, 29*a*, 29*b*: capacitor, 30*a*, 30*b*: variable resistor, 31*a*, 31*b*: constant voltage power supply, 32*a*, 32*b*: resistor, 33: steady current, 34: resistor of the faulty point 22, 35: amount of heat, 36: constant current power supply

The invention claimed is:

1. A circuit inspection method comprising:
   bringing at least one probe into contact with a sample;
   scanning the sample with a charged particle beam while power is supplied via the at least one probe to a circuit formed between a plurality of conductors of the sample by a contact of the at least one probe;
   measuring a change in a resistance value of a faulty point heated locally via the at least one probe;
   absorbing, by the at least one probe, a charged particle beam irradiated on the sample;
   forming a charged particle beam absorption image on a basis of the absorbed charged particle beam; and
   displaying the charged particle beam absorption image.

2. The circuit inspection method according to claim 1, further comprising:
   applying a constant voltage to a circuit formed between a plurality of conductors of the sample by a contact of the at least one probe to supply power to said circuit; and
   measuring a change of end-to-end voltage over the faulty point upon heating to measure a change in the resistance value of the faulty point.

3. The circuit inspection method according to claim 1, further comprising:
   supplying a steady current to a circuit formed between a plurality of conductors of the sample by a contact of the at least one probe to supply power to said circuit; and
   measuring a change of end-to-end voltage over the faulty point upon heating to measure a change in the resistance value of the faulty point.

4. The circuit inspection method according to claim 1, further comprising:
   time-differentiating a signal measured by the at least one probe to measure a change in the resistance value of the faulty point.

5. The circuit inspection method according to claim 1, further comprising:
   imaging a change in the resistance value of the faulty point in synchronization with the scanning of a charged particle beam.

6. The circuit inspection method according to claim 1, further comprising:
   detecting secondary particles generated with the irradiation of the charged particle beam to image surface information of a sample;
   imaging a change in the resistance value of the faulty point in synchronization with the scanning of the charged particle beam; and superimposing an image according to the change in the resistance value of the faulty point on an image of the surface information to identify a position of the faulty point.

7. A sample inspection apparatus comprising:
a sample stage with a sample mounted thereon;
a charged particle beam irradiation system that irradiates the sample with a charged particle beam;
at least one probe that is brought into contact with the sample, and for absorbing a charged particle beam irradiated on the sample;
a power supply that supplies power via the at least one probe to a circuit formed between a plurality of conductors of the sample by a contact of the at least one probe;
a measurement unit that measures a change in the resistance value of a faulty point heated locally using a charged particle optical system, while the power supply supplies power to the circuit identified by the contact of the at least one probe;
a formation unit that forms a charged particle beam absorption image on the basis of a charged particle beam absorbed by the at least one probe; and
a displaying unit that displays the charged particle beam absorption image.

8. The sample inspection apparatus according to claim 7, wherein the measurement unit applies a constant voltage to a circuit formed between a plurality of conductors of the sample by a contact of the at least one probe to supply power to said circuit, and measures a change of end-to-end voltage over the faulty point upon heating to measure a change in the resistance value of the faulty point.

9. The sample inspection apparatus according to claim 7, wherein the measurement unit supplies a steady current to a circuit formed between a plurality of conductors of the sample by a contact of the at least one probe to supply power to said circuit, and measures a change of end-to-end voltage over the faulty point upon heating to measure a change in the resistance value of the faulty point.

10. The sample inspection apparatus according to claim 7, wherein the measurement unit time-differentiates a signal measured by the at least one probe to measure a change in the resistance value of the faulty point.

11. The sample inspection apparatus according to claim 7, wherein the formation unit images a change in the resistance value of the faulty point in synchronization with the scanning of a charged particle beam.

12. The sample inspection apparatus according to claim 7, wherein the formation unit detects secondary particles generated with the irradiation of the charged particle beam to image surface information of a sample, and images a change in the resistance value of the faulty point in synchronization with the scanning of the charged particle beam, and
wherein the display unit superimposes an image according to the change in the resistance value of the faulty point on an image of the surface information.

13. The sample inspection apparatus according to claim 7, wherein said at least one probe comprises a first probe and a second probe, and
wherein said sample inspection apparatus further comprises
an electron source;
a power supply;
a first resistor connected to the power supply and to the first probe;
a second resistor connected to the second probe;
a differential amplifier;
a first capacitor provided between a first input of the differential amplifier and a path connecting the first resistor with the first probe; and
a second capacitor provided between a second input of the differential amplifier and a path connecting the second resistor with the second probe.

14. The sample inspection apparatus according to claim 13, wherein the second probe is connected to the sample stage.

15. The sample inspection apparatus according to claim 13, wherein at least one of the first probe and the second probe is irradiated with an electron beam from the electron source.

* * * * *